United States Patent [19]

Van de Loo et al.

[11] 4,072,377
[45] Feb. 7, 1978

[54] TERMINAL BLOCK

[75] Inventors: Harley J. Van de Loo, Milwaukee; Hans J. Ziegler, Whitefish Bay, both of Wis.

[73] Assignee: Utility Products Co., Milwaukee, Wis.

[21] Appl. No.: 684,884

[22] Filed: May 10, 1976

[51] Int. Cl.² .............................................. H05K 1/10
[52] U.S. Cl. .............................. 339/17 F; 339/103 C; 339/176 MF; 339/198 R; 339/220 R
[58] Field of Search .................... 151/41.72; 339/17 R, 339/17 E, 17 F, 18 R, 18 C, 103 C, 107, 176 MF, 176 MP, 198 R, 220 R

[56] References Cited

U.S. PATENT DOCUMENTS

| 2,359,031 | 9/1944 | Goshia | 151/41.72 |
| 2,472,986 | 6/1944 | Reder | 339/103 C |
| 3,154,366 | 10/1964 | James | 339/220 R |
| 3,573,704 | 4/1971 | Tarver | 339/176 MF |
| 3,701,964 | 10/1972 | Cronin | 339/176 MF |
| 3,936,119 | 2/1976 | Ayer | 339/176 MF |

FOREIGN PATENT DOCUMENTS 690,252 4/1953 United Kingdom ................ 51/41.72

OTHER PUBLICATIONS

Byrnes, Flexible Cable Connector, IBM Technical Disclosure Bulletin, vol. 5, No. 9, Feb. 1963, p. 19.

Primary Examiner—Joseph H. McGlynn
Assistant Examiner—Mark S. Bicks
Attorney, Agent, or Firm—Quarles & Brady

[57] ABSTRACT

A terminal block includes a printed circuit element which has conductive paths deposited on one of its surfaces, with each path extending from a terminal area surrounding an opening in the element to a centralized area. In one embodiment, the printed circuit element is a rigid board and terminals are mounted on the board and extend through each opening and project outwardly on the opposite surface of the board. The terminals are swedged at one end to physically retain them on the board and to electrically connect them to the conductive path. The rigid board is attached to an open box-like shell through which a cable carrying wire conductor extends and connects, interior to the block, to the conductive paths on the circuit board. In another embodiment, the circuit element is a flat, flexible sheet which is disposed against a support board provided with apertures aligned with the openings in the flexible sheet. The terminals extend through both the board and the sheet and may be swedged at one end to grip the support board and flexible element and to electrically connect the terminals to the conductive path. Alternately, the terminals may be soldered to the terminal area surrounding an opening of the flexible sheet. A back plate may be connected to the board to sandwich the flexible sheet therebetween.

2 Claims, 11 Drawing Figures

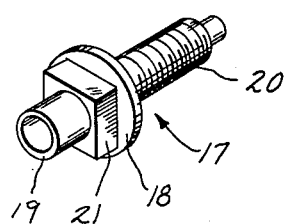
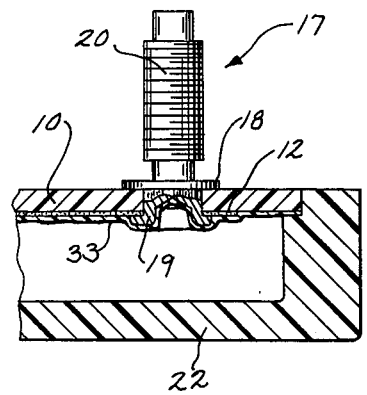
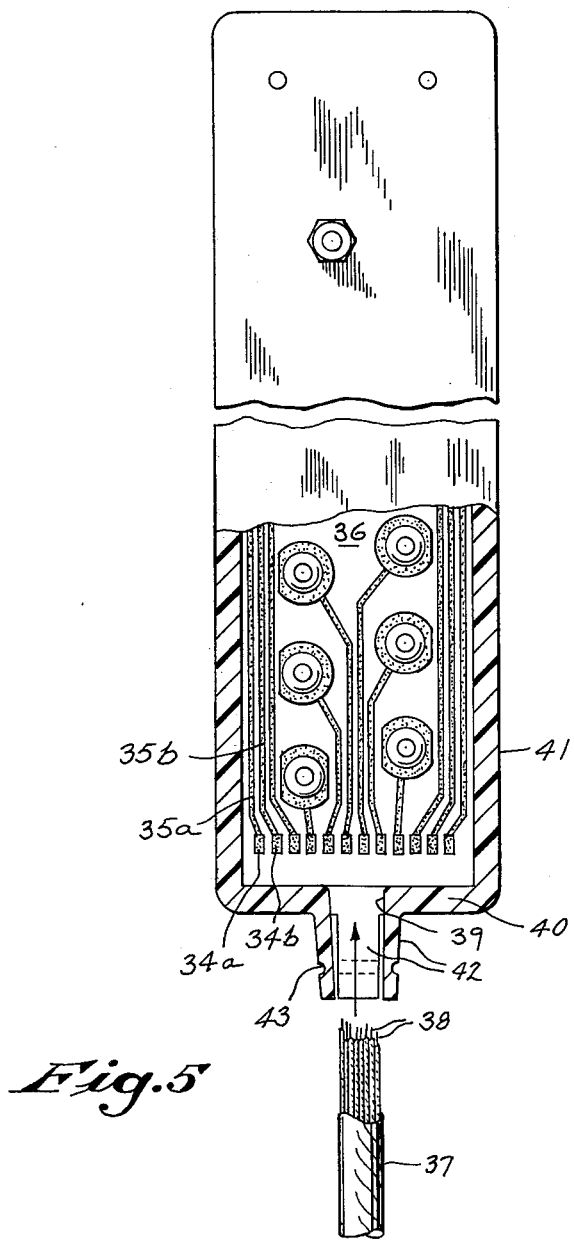
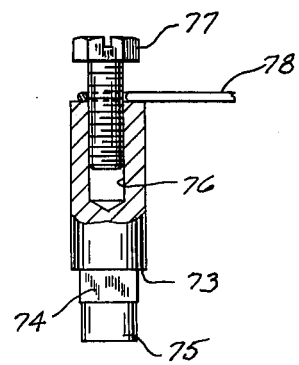
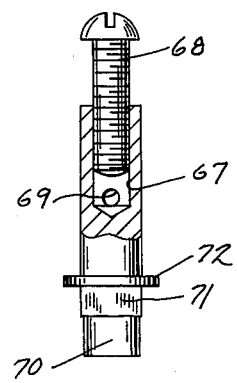

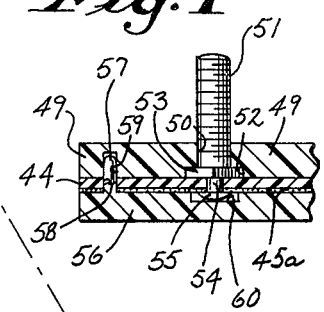
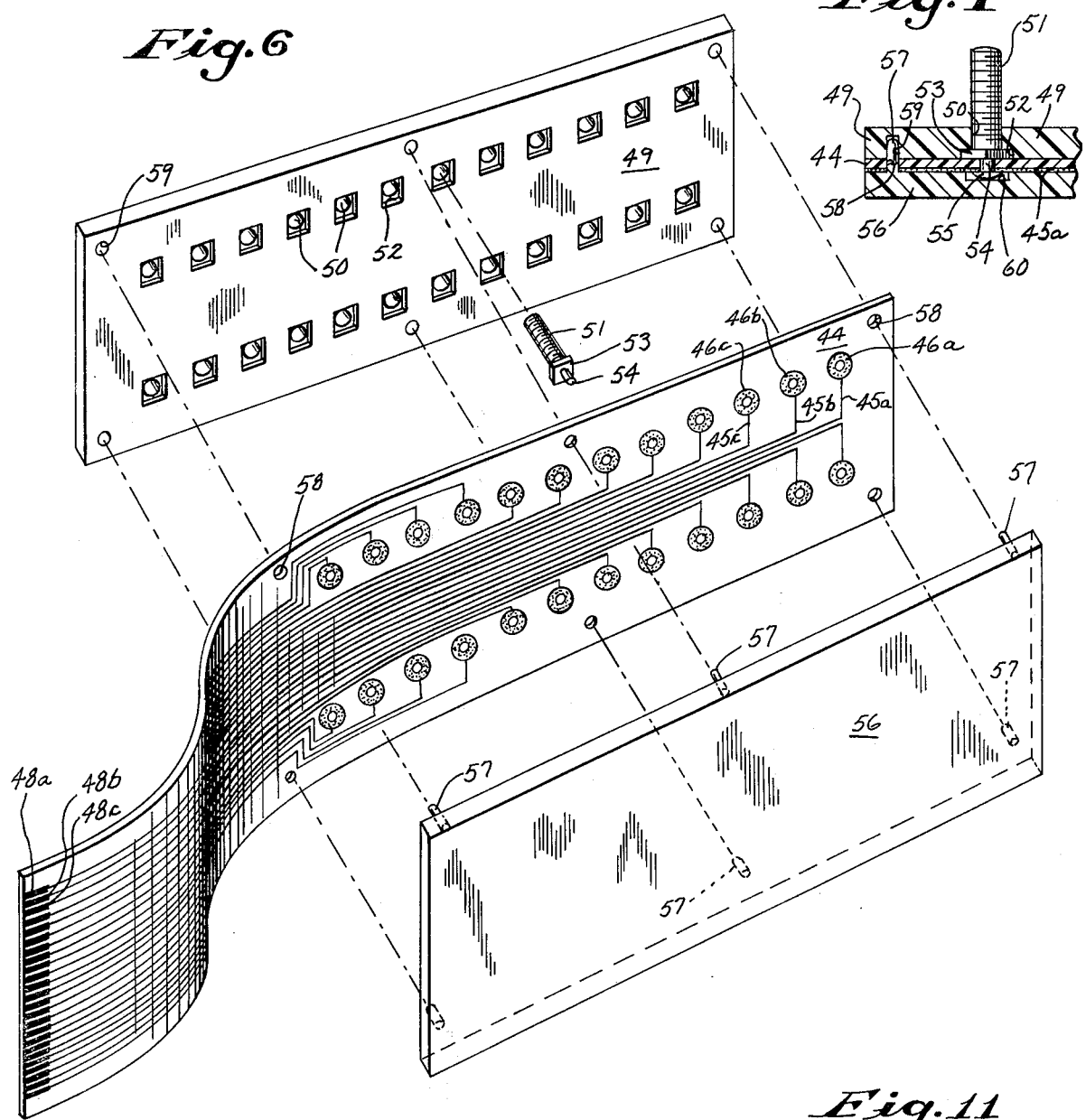
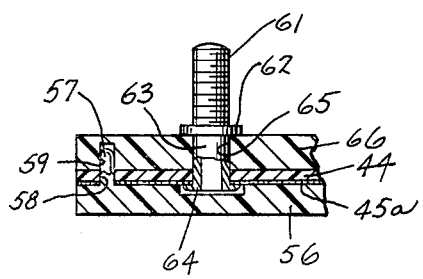
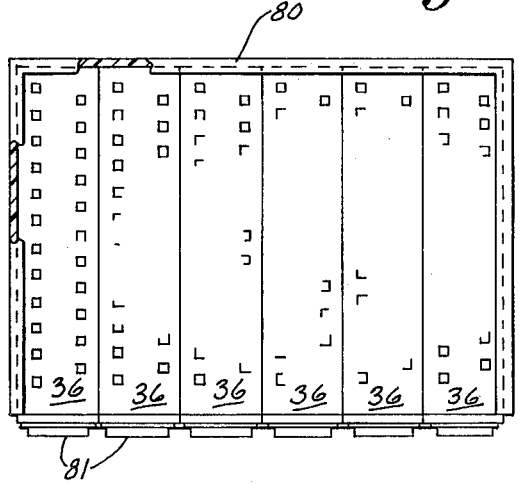

TERMINAL BLOCK

BACKGROUND OF THE INVENTION

This invention relates to terminal blocks, and more particularly to a terminal block assembly which utilizes a printed circuit.

Terminal blocks are used in connection with a wide variety of electrical apparatus. One field in which they find extensive use is in above ground terminal enclosures for buried cable installations. It is typical in such installations to make service connections, cable splices, or cross connections above ground. To accomplish this, the cable is brought above ground at desired locations and the splice, connections to service lines, or cross connections are accomplished within a pedestal-type enclosure provided for that purpose. Typically, the enclosures mount boards to which terminal blocks are attached for making the connections.

A common form of terminal block used in such enclosures consists of a molded dished housing having a series of spaced openings in its face. A stud-type terminal extends through each opening and is connected by means of a nut to the housing. The housing is normally open to the back and wires joined by a sheath into a cable are individually mechanically connected, soldered or welded to the inner ends of the stud terminals. The dished housing is then commonly filled with a potting compound whose purpose is to protect the electrical connections made to the stud terminals within the housing and to provide a mechanical bond to maintain the terminals and conductors in place. Such terminal blocks can be screwed to a flat support with the stud terminals projecting outwardly to allow for manual connections to the terminals extending from the front of the block.

Such typical terminal block construction has several disadvantages. It is very costly to manufacture, in part because it requires considerable manual assembly particularly in connection with the mounting of the terminals and connecting the wire conductors to the terminals within the shell. They are also prone to mechanical and electrical failures because of separation of potting compound from the housing and the resultant bridging of terminals in the housing by moisture migration to the end that there is a failure in the electrical circuit integrity. Such blocks are also prone to erroneous wiring and poor connections because of the manual wire wrapping which is involved.

A terminal block in accordance with the present invention employs printed circuit techniques to provide an economical, yet structurally and electrically sound, terminal block of consistent quality.

STATEMENT OF THE INVENTION

In accordance with the invention there is provided a terminal block which includes a support board having a plurality of spaced apertures, a plurality of separate printed circuit conductive paths disposed on one side of the board and each leading from a terminal area aligned with one of the apertures to a terminus area, with the terminus areas of the paths being grouped together, a terminal extending through each aperture and projecting outwardly from the opposite side of the board, with each terminal being connected in contact with the terminal area of a conductive path and being physically restrained on the board against withdrawal, and cooperating means on each terminal and the board locking the terminals against rotation.

The conductive paths may be deposited directly on one surface of the support board. The terminals may then be formed with a hollow mounting end which is physically deformed after the terminal is in place to grip the board. With the use of a rigid printed circuit board, the invention may also reside in a terminal block in which the board is mounted in a frame in the form of a shell having a back wall and a rim to which the board is attached, with the surface carrying the conductive paths being spaced from and opposing the back wall of the shell, together with a cable extending through the shell and having its conductors connected to respective terminus areas of the conductive paths.

The printed circuit conductive paths may be deposited on a flat flexible sheet which is provided with openings which may be aligned with the apertures of the support board and which are surrounded by the respective terminal areas of the conductive paths. The flexible sheet may be disposed against one side of the support board. The terminals may again be provided with a hollow cylindrical mounting end which is deformed to grip both the support board and the flexible sheet.

Further in accordance with the invention there is provided a method of making a terminal block including forming terminals each with an intermediate shoulder, a mounting end, and a shank having a polygonal cross section disposed between the shoulder and the mounting end, coating the terminals with a solder, forming a plurality of separate conductive paths on one surface of a printed circuit member with each path extending from an enlarged terminal area to a terminus area, coating the conductive paths with a solder, forming an opening through the member at each terminal area, inserting a terminal in each opening, and deforming the mounting end of each terminal to grip the member and to make electrical contact with the terminal area of the respective conductive path.

It is a principal object of this invention to provide a terminal block which is easy to assemble and therefore contributes to low cost.

It is a further object of this invention to provide a terminal block which permits easy connection to a cable having conductors which lead from the terminals.

It is also an object of this invention to provide a terminal block which can be mounted about its periphery in a framework or can be incorporated into a shell which can be made secure against the effects of the environment.

The foregoing and other objects and advantages will appear in the following description in which several embodiments of the terminal block are disclosed. In the description reference is made to the accompanying drawings. Changes can be made with respect to the disclosed embodiment without departing from the scope of the invention which is defined by the appended claims.

BRIEF DESCRIPTION OF THE DRAWINGS

FIG. 3 is a view in perspective of a terminal used in the terminal block of FIG. 1;

FIG. 4 is a view in vertical cross section taken through the terminal block of FIG. 1 and showing a terminal of the form of FIG. 3 assembled thereto;

FIG. 5 is a rear view, with portions broken away for illustration, of an alternate form of terminal block in accordance with this invention;

FIG. 6 is an exploded view in perspective of yet another embodiment of a terminal block in accordance with this invention;

FIG. 7 is a view in vertical cross section taken through the terminal block of FIG. 6 and showing a terminal assembled thereto;

FIG. 8 is a view in vertical cross section similar to FIG. 7 but showing an alternate form of terminal assembled to the block of the type of FIG. 6;

FIGS. 9 and 10 are views in elevation, and partially in section, of alternate forms of terminals which can be employed with any one of the embodiments of FIGS. 1, 5 or 6; and FIG. 11 is a view in elevation of a cross connect array formed of multiple terminal blocks in accordance with this invention.

DETAILED DESCRIPTION OF THE PREFERRED EMBODIMENTS

Figures 1, 2:
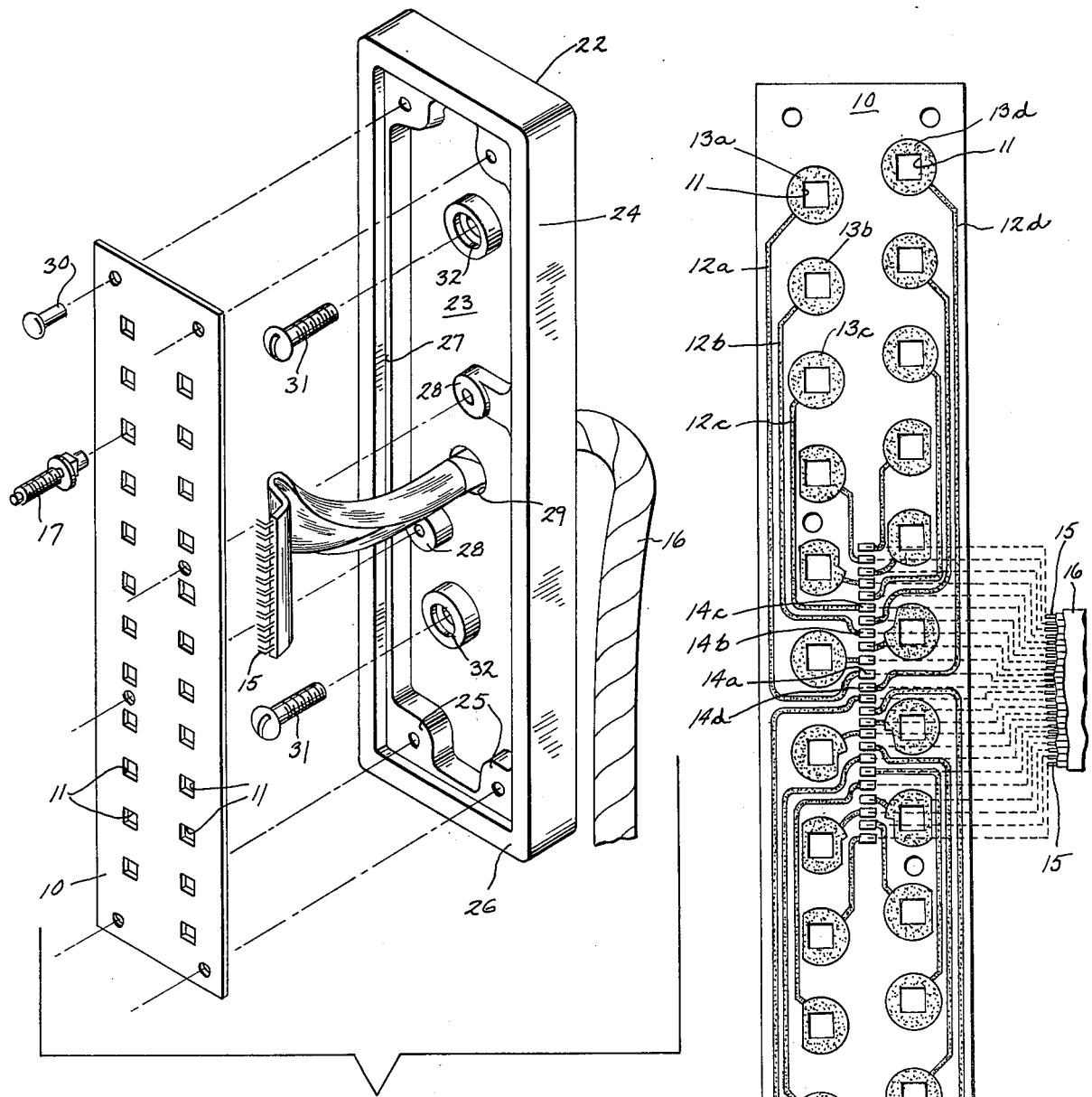
FIG. 1 is an exploded view in perspective of a first embodiment of a terminal block in accordance with this invention.
FIG. 2 is a plan view of the circuit board element of the terminal block of FIG. 1.

Referring to the drawings, a basic element of the terminal block is a printed circuit member. In the first embodiment, the printed circuit member is a rigid board 10 which may be formed of a laminate of epoxy and fiberglass in a known manner so that it is electrically nonconductive and exhibits significant strength.

The board 10 is provided with two rows of square apertures 11. On the back side of the board 10 a plurality of conductive paths are formed by deposit in accordance with standard printed circuit techniques. Specifically, the paths 12a, b, c, etc., each include a narrow conductor portion which joins a large terminal area 13a, b, c, etc., with a somewhat enlarged terminus area 14a, b, c, etc. Each terminal area 13a, b, c, etc., surrounds one of the apertures 11 and the terminus areas 14a, b, c, etc., are grouped at a centralized location on the back side of the board 10 for convenience of attachment to wires 15 joined into a common flat ribbon-type cable 16. As can be seen in FIG. 2, each conductive path 12a, b, c, etc., is separate and distinct from all others.

A plurality of terminals 17 are mounted on the board 10, with one terminal being provided at each of the apertures 11. Referring to FIG. 3, each terminal 17 is formed with a collar 18 intermediate its ends, a hollow circular cylindrical mounting end 19, and a threaded portion 20 towards the other end of the terminal 17. The terminal 17 also has a square shank portion 21 formed between the collar 18 and the mounting end 19. The square shank portion 21 is adapted to mate with the square apertures 11 and the collar 18 is adapted to be seated against the front side of the board 10, as shown in FIG. 4. The terminals 17 are each attached to the terminal board 10 by swedging or otherwise deforming the hollow cylindrical mounting end 19 so that the wall of the mounting end will be bent back upon itself and will be spread. This will result in the board 10 being gripped between the collar 18 and the deformed mounting end 19 to prevent withdrawl of the terminals 17 from the board. It will also accomplish a physical connection between the terminal 17 and the terminal area 13a, b, c, etc., of one of the paths on the back side of the board. The terminals 17 are, therefore, restrained axially on the board 10 and are held against rotation by the cooperating polygonal shank 21 and polygonal apertures 11.

The conductive paths 12a, b, c, etc., may be formed on the board 10 by known printed circuit techniques which involve the deposit of a layer of copper on the surface of the board followed by etching away the portions of the copper layer which are not desired to thereby leave the printed circuit pattern illustrated. The copper circuit pattern is then coated with a layer of solder which will adhere to the copper and not to the surface of the board. The terminals 17 are preferably formed of brass, phosphor bronze, or the like, and are also provided with a coating of solder. Thus, when the terminals 17 are attached to the board 10 and the mounting end 19 is deformed to provide physical connection, an electrical connection will also be accomplished. The act of deforming the mounting end 19 gives results similar to a cold weld and provides a gas-tight electrical connection. The application of additional solder to the joint between the terminals 17 and the conductive paths 12a, b, c, etc., should be unnecessary but can, if desired, be easily provided after attachment of the terminals 17.

The arrangement of the terminus areas 14a, b, c, etc., of the conductive paths at a centralized location on the board 10 facilitates the connection of external conductors to the board 10. In the preferred embodiment, a flat cable 16 is used in which the wires 15 are spaced along the width of the cable 16 and can be readily aligned with the terminus areas 14a, b, c, etc. The flat cable 16 also facilitates the stripping of all of the wires 15 in one step, after which the stripped ends of the wires 15 can be soldered to the terminus areas 14a, b, c, etc., of the paths 12 in one sweep.

In summary, the basic terminal block assembly is made by first forming a pattern of conductive paths on one surface of the terminal board 10, with each path consisting of a terminal area, a terminus area, and a narrow conductor portion leading from the terminal area to the terminus area, and with the terminus areas grouped on the board. The conductive paths are then coated with solder. The apertures 11 are next formed at the locations defined by the terminal areas. The terminals 17 are separately formed and coated with solder. The terminals 17 are then positioned in the apertures 11 with their collars 18 against the front surface of the board 10 and the square shank portions 21 mating with the apertures 11. The terminals 17 would then each be swedged or otherwise deformed to physically and electrically connect the terminals 17 to the board 10. The wires 15, grouped in the form of the cable 16 would be stripped and soldered to the terminus areas 14a, b, c, etc., of the conductive paths 12a, b, c, etc. The result is a printed circuit board having a plurality of terminals projecting from its front face to which conductors can be manually attached and held in place by suitable nuts, and with conductors formed on its back face which are connected to a cable containing wires. The terminal block in this form can be used by mounting it in a frame which holds its perimeter, and then mounting the frame within or to a supporting structure. In the preferred embodiment, however, the block 10 with the terminals and cable 16 in place is mounted in a molded shell.

Specifically, the shell 22 is formed with a back wall 23 and a rim 24 which extends around the entire perimeter of the shell 22. Formed into the shell 22 at each corner are bosses 25 which are recessed from the front face 26 of the shell a distance substantially equal to the thickness of the board 10. The bosses 25 are connected by a shelf 27 which extends within the inner periphery of the rim 24 and is likewise disposed at a distance rearwardly of the front face 26 equal to the thickness of the board 10. Additional pads 28 may also be molded into the shell 22 to support the interior of the board 10. A central opening 29 is provided in the back wall 23 through which the cable 16 can extend. The board 10 is connected to the shell 22 by a plurality of fasteners 30 which extend through holes provided in the board 10 and into bores molded into the corner bosses 25 and pads 28. When attached to the shell 22, the rear surface of the board 10 which carries the conductive paths 12 and the soldered connections to the wires 15 is spaced from and opposes the back wall 23, and the terminals 17 project outwardly from the front face of the assembled terminal block.

The shell 22 has a flat rear surface on the back wall 23 for connection against a support. Attachment can be accomplished by screws 31 which extend through mounting openings 32 molded into the back wall 23, or by screws extending through holes provided in expanded areas of the outer rim. The shell is preferably formed of an ABS resin, or other plastic material, which possesses desirable strength and electrical properties.

Prior to the attachment of the terminal board 10 to the shell 22, the back side of the board 10 may be sprayed with an epoxy or polyurethane material to provide a coating 33 to the conductive paths and to the connections of the terminals 17 and the wires 15 to the paths 12 so as to prevent the possibility of moisture building up upon the electrical connections and bridging the conductors. For this purpose also, the interior space within the assembled terminal block between the board 10 and back wall 23 and within the rim 24 can be filled with a potting compound injected into the hollow interior after the block has been assembled.

In the embodiment of FIG. 5, the terminus areas 34a, b, c, etc., of conductive paths 35a, b, c, etc., are arranged at one end of a rigid printed circuit board 36 instead of in the center of the board. A round cable 37 carrying wires 38 extends through an opening 39 in an end wall 40 of a shell 41. The end wall 40 is part of the rim of the shell 41 and the shell may be formed similar to that shown in the first embodiment. The shell 41 is provided with strain relief means in the form of a ring of integrally molded depending fingers 42 which are spaced from each other and which are provided with a circumferential groove 43. With the cable 37 in place within the fingers 42, the fingers 42 can be flexed and drawn together by means of a snap ring or cable tie seated in the groove 43 to thereby grip the outer circumference of the cable 37. Should a force be exerted on the cable tending to withdraw it from the shell and thereby tending to place strain upon the soldered connections of the wires to the terminus areas, that force will be taken up in the strain relief means and will prevent damage to the soldered connections. A similar strain relief means may be provided at the back of the shell 22 of the first embodiment.

In the embodiment of FIG. 6, rather than depositing the conductive paths directly on one surface of a rigid board, the conductive paths are formed on a flat, flexible sheet which is then placed against a rigid support board to provide the necessary anchoring for the terminals. Specifically, a flat, flexible printed circuit member 44 formed of Mylar, or the like, has a plurality of conductive paths 45a, b, c, etc., deposited on one surface by known printed circuit techniques. The conductive paths include enlarged terminal areas 46a, b, c, etc., each of which have a central opening 47 through the member 44. The conductive paths 45a, b, c, etc., lead to terminus ends 48a, b, c, etc., which are grouped at one end of the flexible member 44 to accommodate connection to an edge connector of known types.

The flexible member 44 is adapted to be disposed against one surface of a rigid support board 49 which is provided with a pattern of apertures 50 which corresponds with the pattern of openings 47 in the flexible member 44. Each of the apertures 50 is formed with a cylindrical shape for its major depth to accommodate the threaded shank of a terminal 51. Adjacent the surface against which the flexible member 44 will be disposed, each aperture is formed with a square recess 52 which accommodates and mates with a square flange 53 provided on each terminal 51. Each of the terminals 51 are also provided with a short pin-type connection end 54 extending axially from the flange 53 and adapted to be received in a respective opening 47 in the flexible member 44. With this type of terminal, the connection end 54 is connected to a respective terminal area 46a, b, c, etc., by solder 55 applied after all terminals 51 are in place on the support board 49 and the flexible member 44 is placed against the board 49 and with its openings receiving each of the connection portions 54 of the terminals 51.

The terminal block of the third embodiment is completed by a back plate 56 having integrally formed pins 57 which extend through corresponding openings 58 formed in the flexible member 44 and are received in bores 59 in the support board 49. The back plate 56 may be provided with recesses 60 to accommodate the solder connections of the terminals 51 to the conductive paths.

The result is a terminal block with a flexible printed circuit member sandwiched between two rigid members for support, with the terminal 51 restrained against withdrawal outwardly of the support board 49 by the flange 53 engaging the board 49 and rearwardly by the back plate 56, and with the terminals 51 restrained against rotation by the cooperating polygonal flanges 53 and polygonal recesses 52 in the board 49.

Referring to FIG. 8, the embodiment employing the flexible printed circuit member may also utilize terminals which are mechanically deformed to grip the member. That is, a terminal having a threaded end 61, a collar 62 intermediate its ends, a polygonal shank portion 63, and a hollow cylindrical mounting end 64 can be employed by forming each of the apertures 65 in the rigid support board 66 with a mating polygonal shape, and by manually deforming the hollow mounting end 64 to thereby grip both the rigid support board 66 and the flexible member 44 between the collar 62 and the swedged mounting end 64.

As with the first embodiments, a moisture resistant coating can be sprayed or otherwise applied to the surface of the flexible member 44 upon which the conductive paths are deposited after partial assembly of the terminal block and prior to attachment of the back plate 56. An adhesive can also be applied to that surface to hold the back plate 56 to the assembly.

The terminals attached to the several embodiments of the terminal block may take different forms than those thus far discussed. Specifically, the terminal can be formed as a binding post (see FIG. 9) having an internally threaded axial bore 67 which receives a screw 68 and with a cross bore 69 which can receive a wire conductor to be held against removal by tightening of the screw 68 within the threaded bore 67. The terminal of FIG. 9 is otherwise the same as the terminals of FIGS. 3 and 8 in that it has a circular cylindrical mounting end 70, a square shank portion 71, and a collar 72. In the terminal of FIG. 10, a shoulder 73 is provided at one end of a square shank portion 74 to abut against one surface of the rigid board, rather than providing a separate collar as in the previous embodiments. As with the previous terminals, however, a hollow cylindrical mounting end 75 is provided. The terminal also has an internally threaded axial bore 76 which receives a slotted hex-head screw 77 so that a wire conductor 78 may be gripped between the head of the screw 77 and the top of the terminal.

Other polygonal shapes can be used for the shank portions or flanges of the terminals and the mating apertures or recesses in the support boards. Thus, the shank portion could be provided with a triangular cross section or a pentagonal cross section and function to prevent rotation of the terminal within the board.

The terminal blocks, whether employing a printed circuit deposited directly on one side of a rigid laminated board, or employing a flexible printed circuit member disposed against a rigid support board, can be joined together to provide an array of terminals particularly useful as a cross connect matrix. Referring to FIG. 11, six terminal blocks of the general type illustrated in the embodiment of FIG. 5, but without the shell, are shown held in place within a frame 80 which surrounds three sides of the perimeter of the array of terminal boards 36. In the cross connect matrix of FIG. 11, edge connectors 81 are shown provided at one end of each of the terminal blocks 36. Alternately, flat or round cables may be connected to the terminus areas of the terminal block.

We claim:

1. A terminal block comprising:
   a rigid support board having a plurality of spaced apertures therein;
   a plurality of separate printed circuit conductive paths disposed on one side of said board, each conductive path including a terminal area aligned with one of said apertures and a terminus area, the terminus areas of the conductive paths being grouped together;
   a terminal extending through each aperture and projecting outwardly from the opposite side of said board, each terminal including a shoulder intermediate its ends and adapted to rest against the surface of said opposite side of said board, and
   a hollow cylindrical mounting end adapted to be received in one of said apertures and to be deformed to physically restrain the terminal on said board against withdrawal and to physically and electrically engage said terminal with said terminal area of the respective conductive path;
   cooperating means on each terminal and said board locking said terminals against rotation on said board,
   said cooperating means comprising a mounting portion with a polygonal cross section on each terminal and a polygonal shape formed at each aperture to receive and mate with said mounting portion;
   a cable carrying conductors each of which is connected to a terminus area of a respective conductive path; and
   a box-like shell having a back wall, an upstanding rim extending about the entire periphery of said back wall, one open side and a cable opening,
   said board being supported on said shell at the rim to close said open side and with the surface of said one side of said board facing the interior of said shell so as to provide a space between said one side of said board and the opposing surface of said back wall, and said cable extending through said cable opening.

2. A terminal block comprising:
   a rigid support board having a plurality of spaced apertures therein;
   a plurality of separate printed circuit conductive paths disposed on one side of said board, each conductive path including a terminal area aligned with one of said apertures and a terminus area, the terminus areas of the conductive paths being grouped together;
   a terminal extending through each aperture and projecting outwardly from the opposite side of said board, each terminal being connected in contact with the terminal area of a respective conductive path, and being physically restrained on said board against withdrawal;
   cooperating means on each terminal and said board locking said terminals against rotation on said board,
   said cooperating means comprising a mounting portion with a polygonal cross section on each terminal and a polygonal shape formed at each aperture to receive and mate with said mounting portion;
   a box-like shell having one open side and a cable opening,
   said board being supported on said shell to close said open side and with the surface of said one side of said board facing the interior of said shell; and
   a flat, flexible cable carrying conductors arranged parallel to each other and with each conductor connected to a terminus area of a respective conductive path,
   said terminus areas being arranged in a single row, and
   said cable being folded back upon itself within said shell and with a portion of said cable extending through said cable opening and being formed into a generally cylindrical bundle.

* * * * *